United States Patent
Huang et al.

(10) Patent No.: US 9,274,416 B2
(45) Date of Patent: Mar. 1, 2016

(54) METHOD FOR FORMING PHOTO-MASK AND OPC METHOD

(71) Applicant: UNITED MICROELECTRONICS CORP., Hsin-Chu (TW)

(72) Inventors: Chun-Hsien Huang, Tainan (TW);
Ming-Jui Chen, Hsinchu (TW);
Chia-Wei Huang, Kaohsiung (TW);
Hsin-Yu Chen, Nantou County (TW);
Kai-Lin Chuang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 267 days.

(21) Appl. No.: 14/023,476

(22) Filed: Sep. 11, 2013

(65) Prior Publication Data
US 2015/0072272 A1    Mar. 12, 2015

(51) Int. Cl.
*G03F 1/72* (2012.01)
*G03F 1/00* (2012.01)

(52) U.S. Cl.
CPC . *G03F 1/72* (2013.01); *G03F 1/144* (2013.01)

(58) Field of Classification Search
CPC .................................. G03F 1/144; G03F 17/50
USPC .................................................. 430/5; 716/53
See application file for complete search history.

(56) References Cited

U.S. PATENT DOCUMENTS

| | | | |
|---|---|---|---|
| 6,968,532 B2 | 11/2005 | Sivakumar | |
| 7,142,282 B2 | 11/2006 | Borodovsky | |
| 7,887,996 B2 | 2/2011 | Liu | |
| 8,058,177 B2 | 11/2011 | Weiss | |
| 2009/0181314 A1* | 7/2009 | Shyu et al. | 430/5 |
| 2013/0024824 A1* | 1/2013 | Huang et al. | 716/53 |

* cited by examiner

*Primary Examiner* — Stephen Rosasco
(74) *Attorney, Agent, or Firm* — Winston Hsu; Scott Margo (57) ABSTRACT

A method for forming a photo-mask is provided. A first photo-mask pattern relating to a first line, an original second photo-mask pattern relating to a first via plug, and a third photo-mask pattern relating to a second line are provided. A first optical proximity correction (OPC) process is performed. A second OPC process is performed, comprising enlarging a width of the second photo-mask pattern along the first direction to form a revised second photo-resist pattern. A contour simulation process is performed to make sure the revised second photo-mask pattern is larger or equal to the original second-mask pattern. The first photo-mask pattern, the revised second photo-mask pattern, and the third photo-mask pattern are output. The present invention further provides an OPC method.

10 Claims, 8 Drawing Sheets

METHOD FOR FORMING PHOTO-MASK AND OPC METHOD

BACKGROUND OF THE INVENTION

1. Field of the Invention

The present invention relates to an OPC method and method using the OPC method for forming at least a photo-mask, and more particularly, the photo-masks are used in a self aligned via (SAV) process.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern. Currently, a technique called "optical proximity correction (OPC)" is developed. The OPC method is used to imitate the feature that light passes through the photo-mask and to further compensate the pattern of the mask to form the desired pattern after the exposure process.

In the conventional arts, the "dual damascene" process is widely used to form a metal interconnection system which is consisted of metal lines and plugs. However, the OPC method used for forming the masks of the metal interconnection system is not well studied.

SUMMARY OF THE INVENTION

The present invention therefore provides a method for forming at least a photo-mask, which can be used in a dual-damascene process, especially a SAV process.

A method for forming a photo-mask is provided. A first photo-mask pattern relating to a first line, an original second photo-mask pattern relating to a first via plug, and a third photo-mask pattern relating to a second line are provided. The first line, the first via plug and the second line are disposed in sequence in a semiconductor structure, and the first via plug is disposed at the intersection of the first line and the second line. A first optical proximity correction (OPC) process is performed, comprising a comparing step and/or a modification step for the original second photo-mask pattern. A second OPC process is performed, comprising enlarging a width of the second photo-mask pattern along the first direction. A revised second photo-resist pattern is formed. A contour simulation process is performed to make sure the revised second photo-mask pattern is larger or equal to the original second-mask pattern. The first photo-mask pattern is output to form a first photo-mask, the revised second photo-mask pattern is output to form a second photo-mask, and the third photo-mask pattern is output to form a third photo-mask.

According to another embodiment, an OPC process is provided. A first photo-mask pattern relating to a first line, an original second photo-mask pattern relating to a first via plug, and a third photo-mask pattern relating to a second line are provided. The first line, the first via plug and the second line are disposed in sequence in a semiconductor structure, and the first via plug is disposed at the intersection of the first line and the second line. A first optical proximity correction (OPC) process is performed, comprising a comparing step and/or a modification step for the original second photo-mask pattern. A second OPC process is performed, comprising enlarging a width of the second photo-mask pattern along the first direction. A revised second photo-resist pattern is formed. A contour simulation process is performed to make sure the revised second photo-mask pattern is larger or equal to the original second-mask pattern.

The method is characterized in that the second OPC process is performed to enlarge the width of the second photo-mask pattern along the first direction. Since it is specially applied to the SAV process, the second photo-mask with enlarged width can gain more process window but does not affect the formed area of the first via plug.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
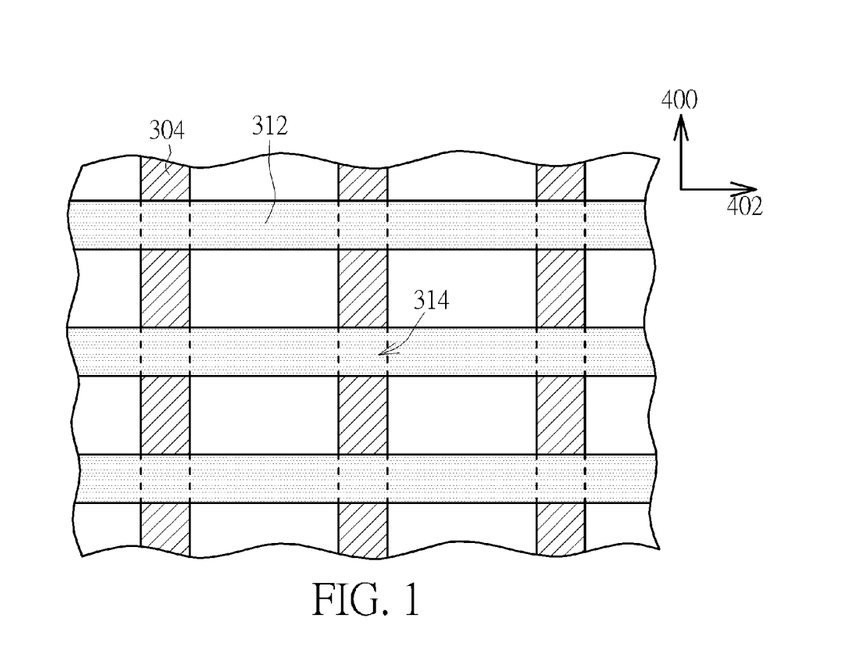
FIG. 1 to FIG. 7 show schematic diagrams of the semiconductor structure in the present invention.
Figure 7:
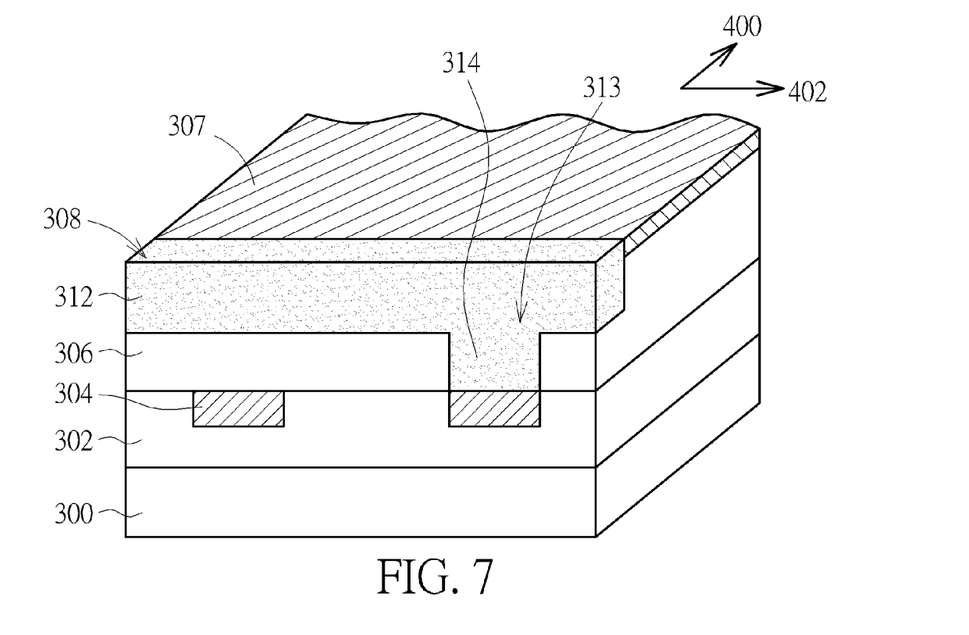

The present invention is related to a method for forming photo-masks which is used in a semiconductor process to form a semiconductor structure. In one embodiment, the semiconductor process is a metal dual damascene process, and the semiconductor structure is a metal interconnection system, but is not limited thereto. Please refer to FIG. 1 and FIG. 7, which show schematic diagrams of the semiconductor structure in the present invention, wherein FIG. 1 shows a top view and FIG. 7 shows a three dimensional view. As shown in FIG. 1 and FIG. 7, the semiconductor structure to be formed in the present invention, for example, includes a first metal line 304, a first via plug 314 and a second metal line 312, which are disposed in a first dielectric layer 302 and a second dielectric layer 306. In one embodiment, the first metal line 304 extends along a first direction 400, and the second metal line 312 extends along a second direction 402. Preferably, the first direction 400 and the second direction 402 is substantially perpendicular to each other, but is not limited thereto. It is noted that the numbering only shows the relative position but does not indicate the real stacking position on the substrate.

In one preferred embodiment, the semiconductor device shown in FIG. 1 and FIG. 7 is fabricated by a "self aligned via (SAV) process" which includes using a first photo-mask (not shown) corresponding to the first metal line 304, a second photo-mask (not shown) corresponding to the first via plug 314, and a third photo-mask (not shown) corresponding to the second metal line 312. For the detail description of the SAV process, please refer to FIG. 2 to FIG. 7, which show three dimensional schematic diagrams of the method for forming a semiconductor structure in the present invention.

Figure 2:
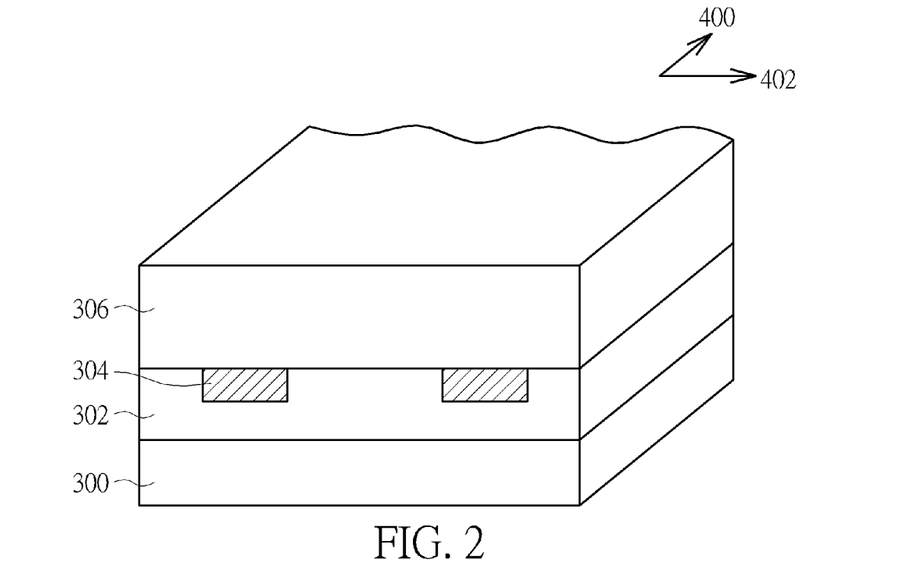

As shown in FIG. 2, a substrate 300 is provided. The substrate 300 may be a silicon substrate or a dielectric layer on the silicon substrate, but is not limited thereto. A first dielectric layer 302 is formed on the substrate 300. The first metal line 304 stretching along the first direction 400 is formed in the first dielectric layer 302. The step of forming the first metal line 304, for example, includes forming a photo-resist layer (not shown) and then patterning it by using the first photo-mask (not shown), then, an etching process is carried out by using the patterned photoresist layer as a mask to pattern the first dielectric layer 302, thereby forming a trench (not shown), then filling a metal layer into the trench and performing a planarization process. The first metal line 304 is therefore in the first dielectric layer 302. After forming the first metal line 304, a second dielectric layer 306 is formed on the first dielectric layer 302.

Figure 3:
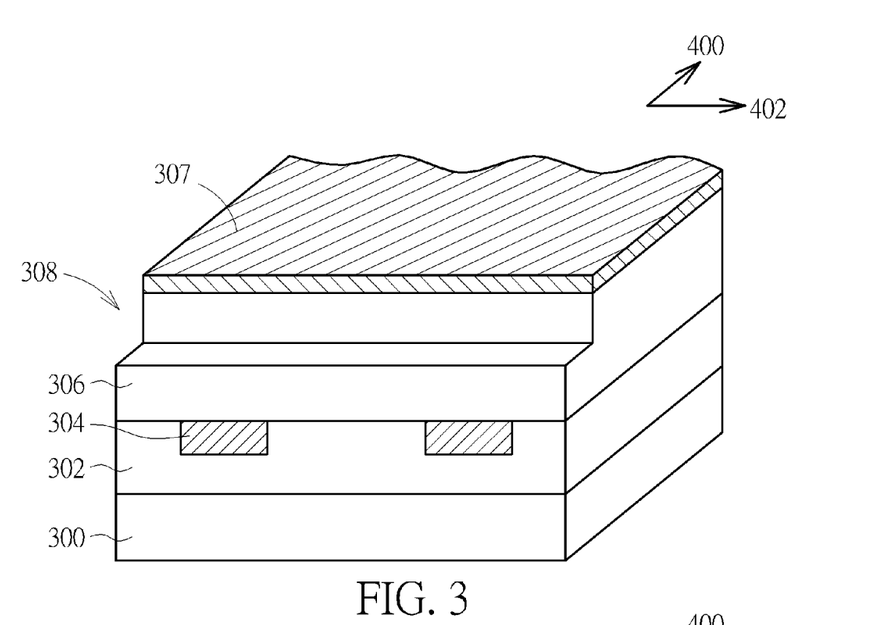

As shown in FIG. 3, at least a trench 308 is formed in the second dielectric layer 306. The step of forming the trench 308 includes a photo-etching-process (PEP) by using the third photo-mask (not shown) (which may be similar to the steps shown above), so as to form a patterned mask layer 307. By performing an etching process as using the patterned mask layer 307 as a hard mask, the trench 308 is formed in the second dielectric layer 306 and is stretching along the second direction 402.

Figure 4:
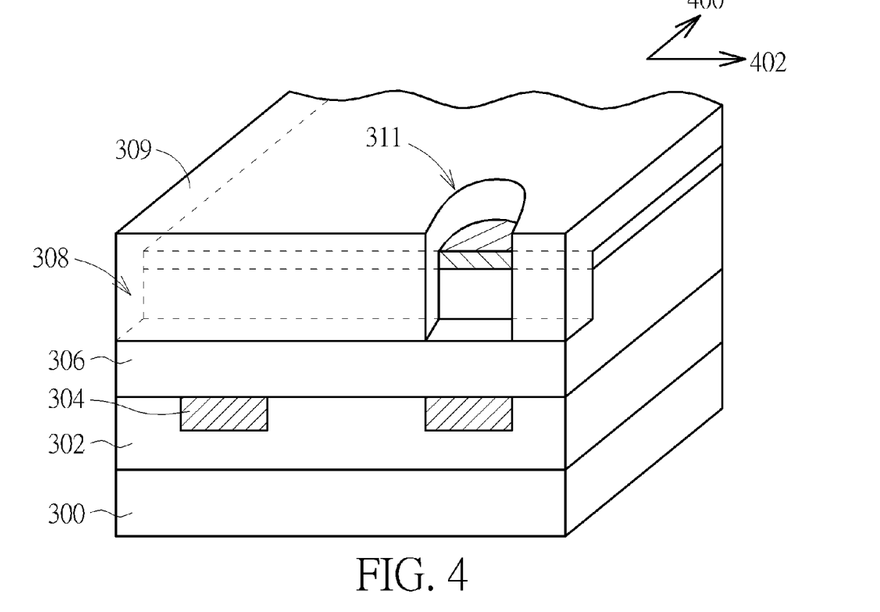

As shown in FIG. 4, a photoresist layer 309 is formed on the second dielectric layer 306, filling the trench 308 and covering the patterned mask layer 307. Then, a lithography process is performed by using a second photo-mask (not shown) to form an opening 311. The opening 311 therefore exposes the second dielectric layer 306 in the trench 308. As shown FIG. 4, in some circumstances, the opening 311 is large than expected (for example, a width of the opening 311 is larger than the width of the trench 308 along the first direction 400). But since the second dielectric layer 306 in the trench 308 is not covered by the patterned mask layer 307, after forming the opening 311, only the second dielectric layer 306 in the trench 308 is exposed.

Figure 5:
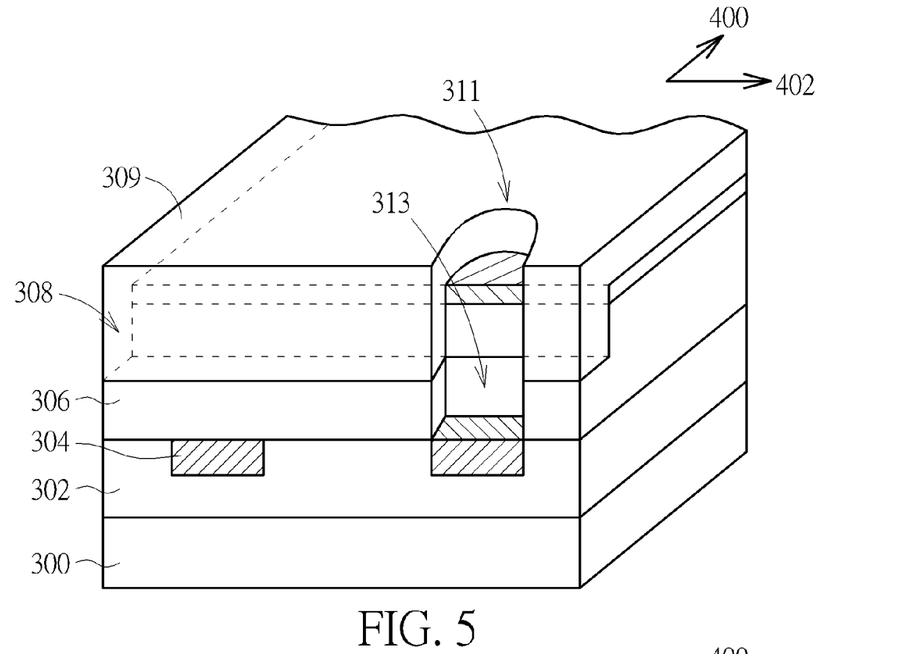

As shown in FIG. 5, an etching process is carried out by using the patterned photoresist layer 309 as a mask to etch the second dielectric layer 306 until exposing the first metal line 304. Similarly, due to the patterned mask layer 307 which has an etching selectivity with respect to the second dielectric layer 306, only the second dielectric layer 306 in the trench 308 is removed, and those outside the trench 308 covered by the patterned mask layer 307 is not removed.

Figure 6:
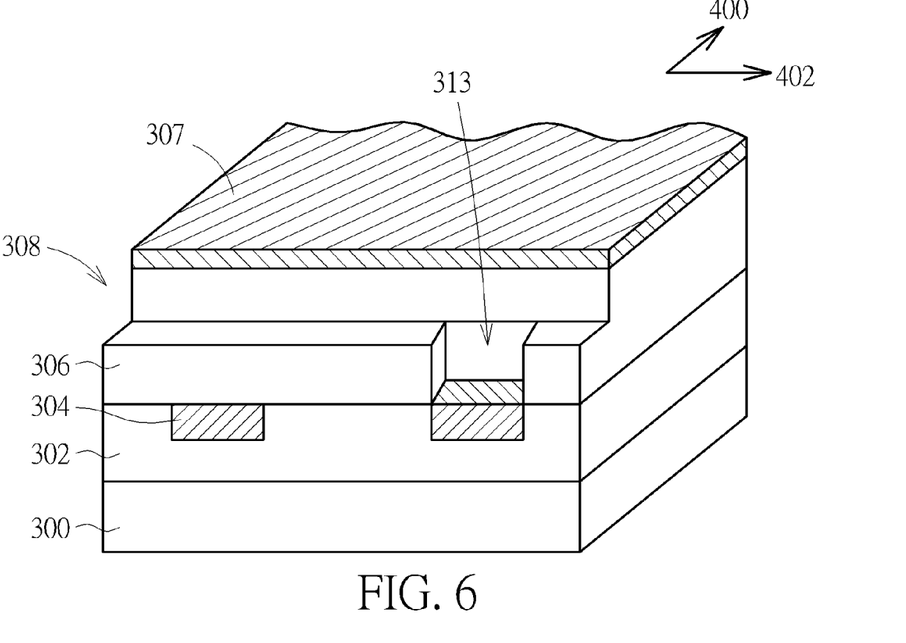

As shown in FIG. 6, the photoresist layer 309 is removed away. A via 313 exposing the first metal line 304 is therefore formed. Lastly, as shown in FIG. 7, a metal material is filled into the trench 308 and the via 313 and a planarization process is performed by using the patterned mask layer 307 as a mask. The patterned mask layer 307 can be completely removed or partially removed. Accordingly, the metal material in the trench 308 becomes a second metal line 312 and the metal material in the via 313 becomes the first via plug 314. As shown in the above description, since the via 313 can only be formed within the trench 308, the first via plug 314 is therefore referred to as a "self aligned via (SAV)" and the method through FIG. 2 to FIG. 7 is referred as a SAV process.

Figure 8:
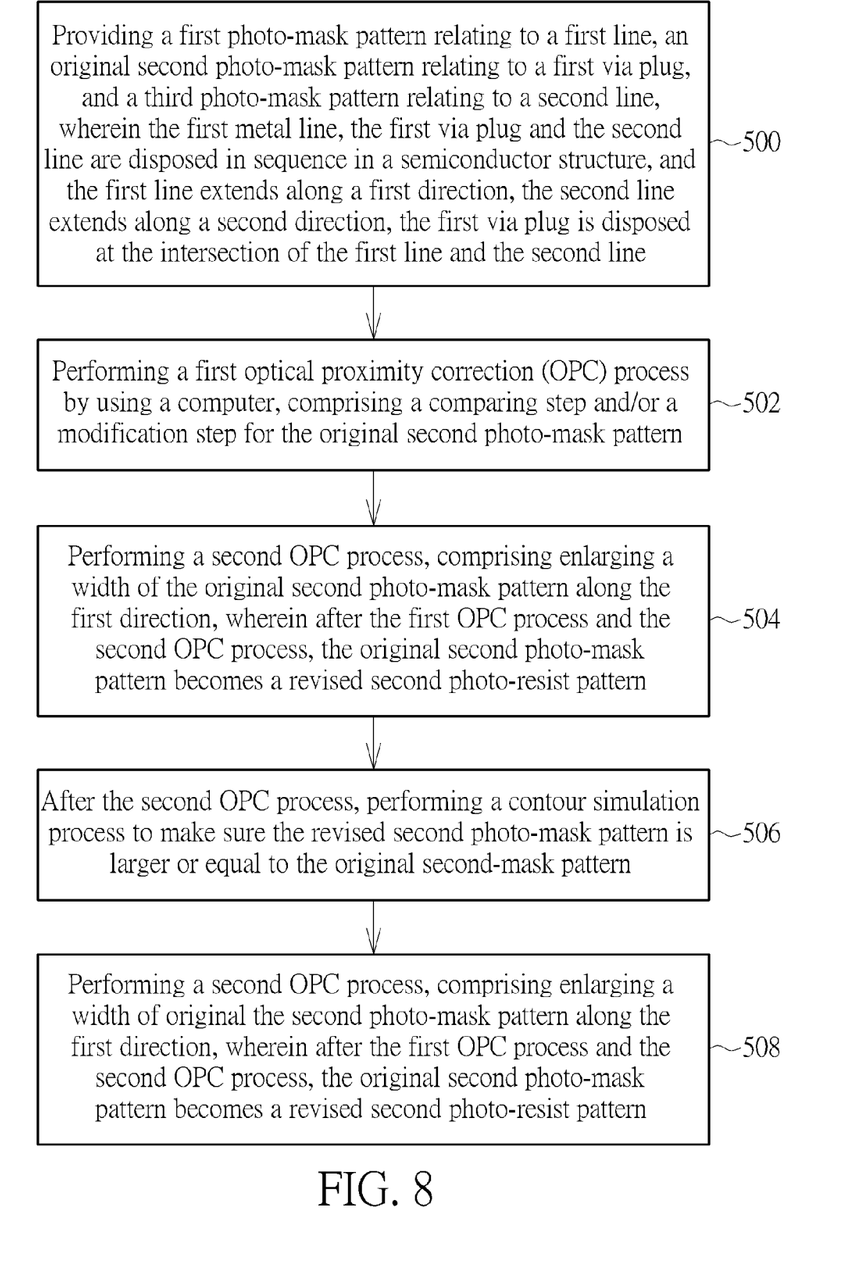
FIG. 8 shows a flow chart of the method for forming a photo-resist in the present invention.

According to the SAV process, the present invention further provides a method for forming a first photo-mask, a second photo-mask, and a third photo-mask, wherein the first photo-mask corresponds to the first metal line 304, the second photo-mask corresponds to the first via plug 314, and the third photo-mask corresponds to the second metal line 312. Please refer to FIG. 8, illustrating a flow chart of the method for forming a photo-resist in the present invention. For detail description, please also refer to FIG. 9 to FIG. 13, which are schematic diagrams showing the layout of the first photo-mask, the second photo-mask, and the third photo-mask in the present invention.

Figure 9:
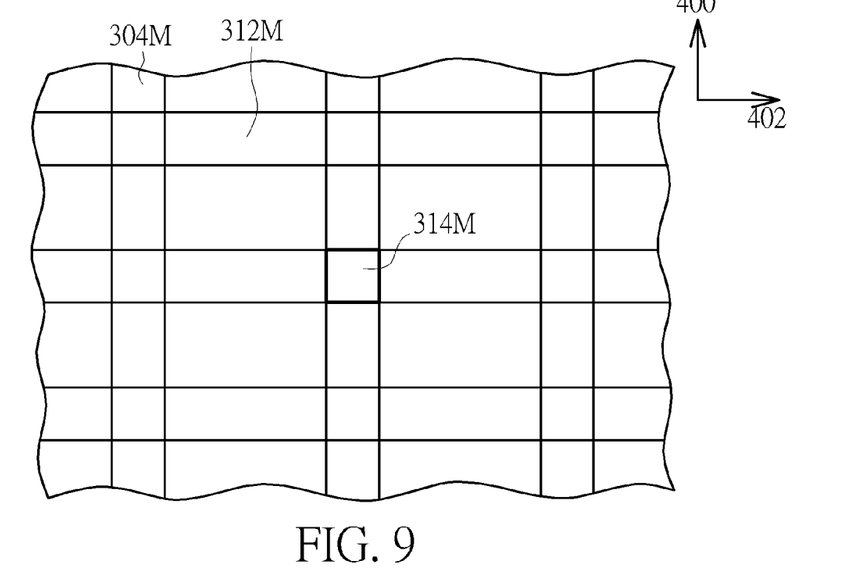
FIG. 9 to FIG. 13 show schematic diagrams of the layout of the first photo-mask, the second photo-mask, and the third photo-mask in the present invention.

As shown in the step 500 of FIG. 8 and FIG. 9, a first photo-mask pattern 304M, a second photo-mask pattern 314M and a third photo-mask pattern 312M are provided. In the present invention, the first photo-mask pattern 304M is related to the first metal line 304 in FIG. 1, the second photo-mask pattern 314M is related to the first via plug 314 in FIG. 1, and the third photo-mask pattern 312M is related to the second metal line 312 in FIG. 1. The first photo-mask pattern 304M extends along a first direction 400 and the third photo-resist mask pattern 312M extends along a second direction 402. The second photo-resist mask pattern 314M is disposed at the intersection of the first photo-mask pattern 304M and the third photo-mask pattern 312M.

Figure 10:
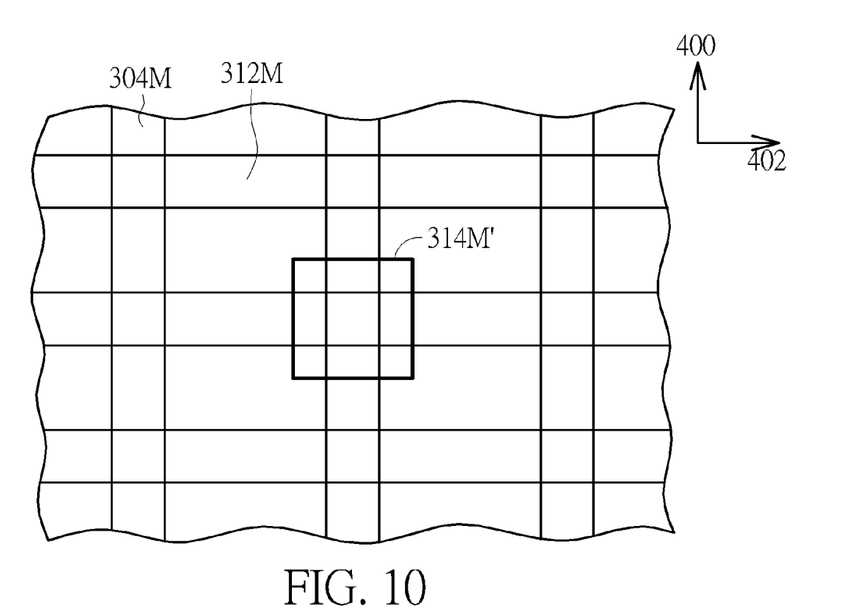

As shown in the step 502 of FIG. 8 and FIG. 10, a first optical proximity correction (OPC) process is performed. In one embodiment, the first OPC can be any conventional OPC methods that include a comparing step and/or a modification step. The comparing step considers the shape, the area or the relative position of the second photo-mask pattern 314M according to a rule, and if the second photo-mask pattern 314M needs to be modified, the modification step will modify the second photo-mask pattern 314M. After the modification step of the first OPC process, the original second photo-mask pattern 314M becomes a second photo-mask pattern 314M', which has a greater area in the present embodiment. In another embodiment, if no modification step is required, the original second photo-mask pattern 314M is not changed.

Figure 11:
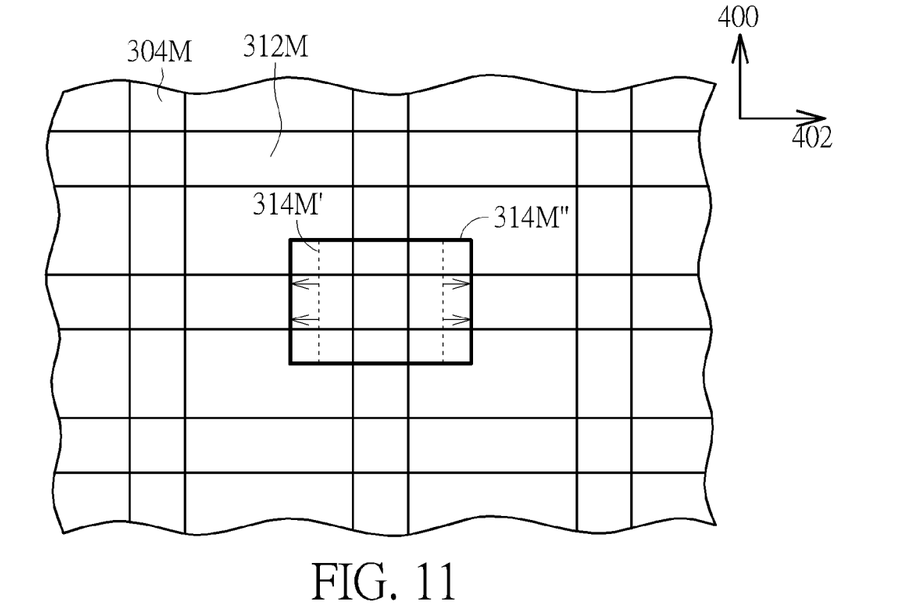
Figure 12:
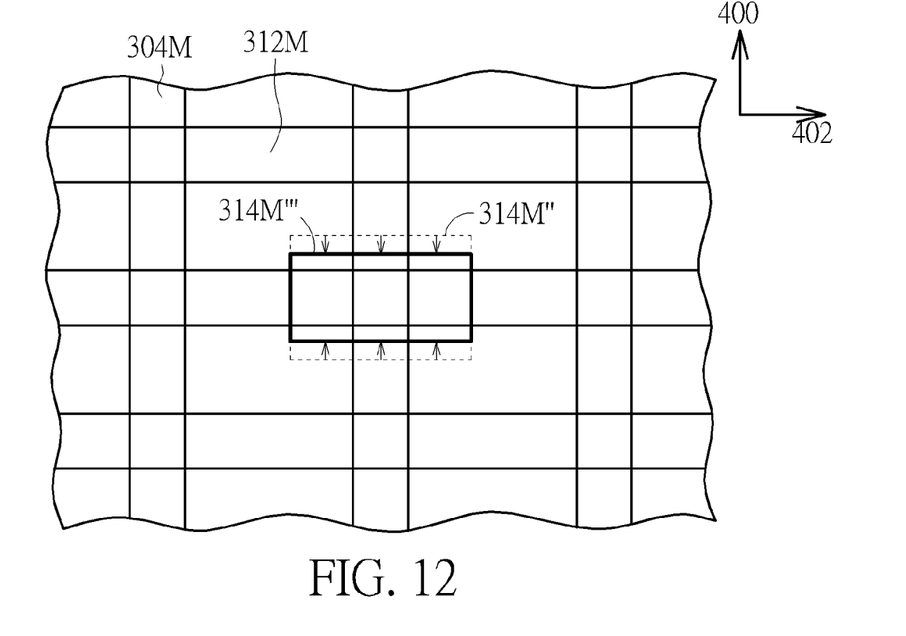

As shown in the step 504 of FIG. 8 and FIG. 11, a second OPC process is performed by enlarging a width of the second photo-mask pattern 314M' along the second direction 402 to form a second photo-resist pattern 314M". It is understood that, according to the SAV process, the first via plug 314 (corresponding to the second photo-mask pattern 314M) is formed within the trench 308 (corresponding to the third photo-mask pattern 312M), so enlarging the width of the second photo-mask pattern 314M' along the second direction 402 would not affect the formed area of the first via plug 314. On the other hand, enlarging the width of the second photo-mask pattern 314M' can increase the process window so the accuracy of the method can be improved. In one embodiment, the enlarging step can be performed by a Boolean process to calculate the value of the enlarging width. In another embodiment, as shown in FIG. 12, the length of the second photo-mask pattern 314M' along the first direction 400 can be reduced, so as to maintain the depth of field (DOF) of each via pattern and keep the area around a fixed value. After the second OPC process, the second photo-mask pattern 314M''' becomes a revised second photo-mask pattern 314M'''.

In one embodiment, the sequence of the first OPC process and the second OPC process can be exchanged. Preferably, the first OPC process is performed before the second OPC process.

Figure 13:
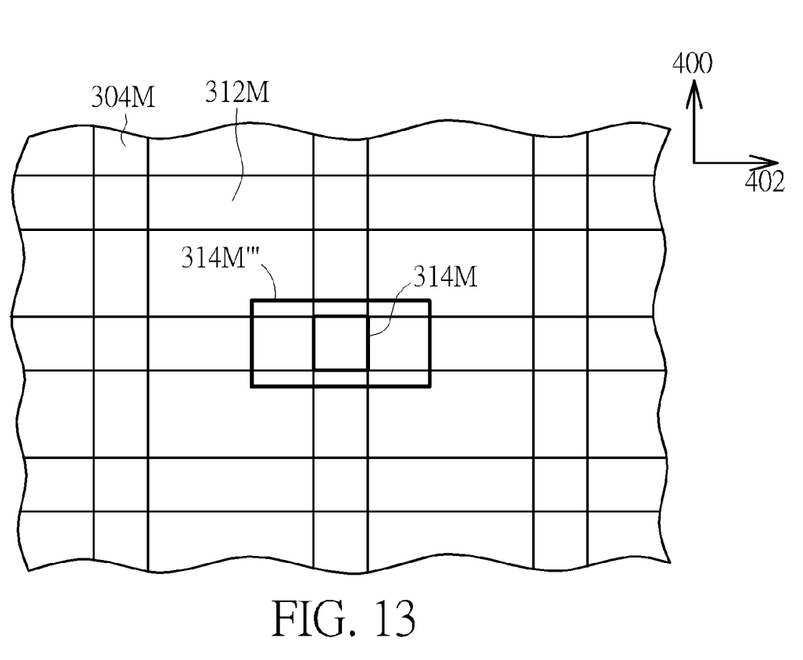

As shown in the step 506 of FIG. 8 and FIG. 13, a contour simulation process is performed to make sure the revised second photo-mask pattern 314M''' is larger than or equal to the original second-mask pattern 314M. If the revised second photo-mask pattern 314M''' is smaller than the original second photo-mask pattern 314M, another modification process is carried out to enlarge the revised second mask pattern 314M''' until it is not less than the original second mask pattern 314M.

Lastly, the first photo-mask pattern 304M is output to form a first photo-mask (not shown), the revised second photo-mask pattern 314M''' is output to form a second photo-mask (not shown), and the third photo-mask pattern 312M is output to form a third photo-mask pattern (not shown). Thereafter, the first photo-mask, the second photo-mask and the third photo-mask pattern can be used in the SAV method, as shown in FIG. 2 to FIG. 7 for example, so as to form the semiconductor device in FIG. 1 and FIG. 7.

It is noted that the method for forming a photo-mask in the present invention is not limited to the above-mentioned embodiment. For example, the structure to be formed is not limited to the dual damascene structure in FIG. 1 and FIG. 7, but can be any structure that has an upper line pattern, a lower line pattern and a via pattern disposed therebetween. The upper line pattern can intersect the lower pattern in any angle and the via pattern is located at the intersection.

In summary, the present invention provides a method for forming a photo-mask. The method is characterized in that the second OPC process is performed to enlarge the width of the second photo-mask pattern along the second direction. Since the method is specially applied to the SAV process, the second photo-mask with enlarged width can gain more process window but does not affect the formed area of the first via plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a photo-mask, comprising:
    providing a first photo-mask pattern relating to a first line, an original second photo-mask pattern relating to a first via plug, and a third photo-mask pattern relating to a second line, wherein the original second photo-mask pattern is defined only at an intersection of the first photo-mask pattern and the third photo-mask pattern, the first metal line, the first via plug and the second line are disposed in sequence in a semiconductor structure, and the first line extends along a first direction, the second line extends along a second direction, the first via plug is disposed at the intersection of the first line and the second line;
    performing a first optical proximity correction (OPC) process by using a computer, comprising a comparing step and/or a modification step for the original second photo-mask pattern;
    performing a second OPC process, comprising enlarging a width of the original second photo-mask pattern along the second direction, wherein after the first OPC process and the second OPC process, the original second photo-mask pattern becomes a revised second photo-resist pattern; and
    after the second OPC process, performing a contour simulation process to make sure the revised second photo-mask pattern is larger or equal to the original second-mask pattern; and
    outputting the first photo-mask pattern to form a first photo-mask, outputting the revised second photo-mask pattern to form a second photo-mask, and outputting the third photo-mask pattern to form a third photo-mask.

2. A method for forming a photo-mask according to claim 1, wherein the second OPC process is performed after the first OPC process.

3. A method for forming a photo-mask according to claim 1, wherein the second OPC process comprises a Boolean process.

4. A method for forming a photo-mask according to claim 1, wherein the second OPC process further comprises reducing a length of the original second photo-mask pattern along the first direction.

5. A method for forming a photo-mask according to claim 1, wherein the first direction is substantially perpendicular to the second direction.

6. A method for forming a photo-mask according to claim 1, wherein the semiconductor structure is formed by a self aligned via process by using the first photo-mask, the second photo-mask and the third photo-mask.

7. An optical proximity correction (OPC) process, comprising:
    providing a first photo-mask pattern relating to a first line, an original second photo-mask pattern relating to a first via plug, and a third photo-mask pattern relating to a second line, wherein the original second photo-mask pattern is defined only at an intersection of the first photo-mask pattern and the third photo-mask pattern, the first line, the first via plug and the second line are disposed in sequence in a semiconductor structure, and the first line extends along a first direction, the second line extends along a second direction, the first via plug is disposed at the intersection of the first line and the second line;
    performing a first optical proximity correction (OPC) process by using a computer, comprising a comparing step and/or a modification step for the original second photo-mask pattern;
    performing a second OPC process, comprising enlarging a width of the original second photo-mask pattern along the second direction, wherein after the first OPC process and the second OPC process, the original second photo-mask pattern becomes a revised second photo-resist pattern; and
    after the second OPC process, performing a contour simulation process to make sure the revised second photo-mask pattern is larger or equal to the original second-mask pattern.

8. An OPC method according to claim 7, wherein the second OPC process is performed after the first OPC process.

9. An OPC method according to claim 7, wherein the second OPC process comprises a Boolean process.

10. An OPC method according to claim 7, wherein the second OPC process further comprises reducing a length of the original second photo-mask pattern along the first direction.

* * * * *